(12) United States Patent
Takato et al.

(10) Patent No.: US 6,452,090 B2
(45) Date of Patent: Sep. 17, 2002

(54) PHOTOVOLTAIC DEVICE

(75) Inventors: Hidetaka Takato, Tsukuba; Ryuichi Shimokawa, Ibaraki, both of (JP)

(73) Assignee: Agency of Industrial Science & Technology, Ministry of International Trade & Industry, Tokyo (JP)

( * ) Notice: Subject to any disclaimer, the term of this patent is extended or adjusted under 35 U.S.C. 154(b) by 0 days.

(21) Appl. No.: 09/749,902

(22) Filed: Dec. 29, 2000

(30) Foreign Application Priority Data

Jan. 19, 2000 (JP) ........................................ 2000-010876

(51) Int. Cl.$^7$ .............................................. H01L 31/04
(52) U.S. Cl. ...................... 136/255; 136/256; 136/249; 136/261; 257/461; 257/431
(58) Field of Search .............................. 136/255, 256, 136/249, 261; 257/461, 431

(56) References Cited

U.S. PATENT DOCUMENTS

| | | | | |
|---|---|---|---|---|
| 2,874,341 A | * | 2/1959 | Biondi et al. | 136/256 |
| 4,070,689 A | * | 1/1978 | Coleman et al. | 136/255 |
| 5,290,367 A | * | 3/1994 | Hayashi et al. | 136/255 |
| 5,482,570 A | * | 1/1996 | Saurer et al. | 136/255 |

FOREIGN PATENT DOCUMENTS

JP    10-150211    6/1998

OTHER PUBLICATIONS

Kenji Yamamoto, "Very Thin Film Crystalline Silicon Solar Cells on Glass Substrate Fabricated at Low Temperature", IEEE Transactions on Electron Devices, vol. 46, No. 10, Oct. 1999, pp. 2041–2047.

* cited by examiner

*Primary Examiner*—Alan Diamond
(74) *Attorney, Agent, or Firm*—Oblon, Spivak, McClelland, Maier & Neustadt, P.C.

(57) ABSTRACT

A photovoltaic device includes a semiconductor substrate, an n-type diffusion layer region and a p-type diffusion layer region formed adjacent to each other on the light-receiving surface of the semiconductor substrate, a first electrode electrically connected to the n-type diffusion layer region, a second electrode electrically connected to the p-type diffusion layer region, an adhesive layer formed on the opposite surface of the semiconductor substrate and containing an inorganic binder and a filler, and a supporting substrate adhered to the adhesive layer.

12 Claims, 1 Drawing Sheet

PHOTOVOLTAIC DEVICE

BACKGROUND OF THE INVENTION

1. Field of the Invention

This invention relates to a photovoltaic device that converts incident light energy to electrical energy, and more specifically it relates to a photovoltaic device that is suitable for use as a thin-film solar cell.

2. Description of the Prior Art

Silicon solar cells, which are a type of photovoltaic device, for power applications include mainly those cells that utilize a single-crystalline silicon or polycrystalline silicon substrate about 300 μm thick, but thin-film substrates are desired to reduce the amount of silicon used and reduce cost.

A number of measures have been taken to improve the characteristics of thin-film solar cells. In order to improve conversion efficiency, for example, a structure was proposed for the purpose of improving conversion efficiency, wherein the glass substrate is provided with a textured reflective mirror, whereon a textured silicon layer is deposited (K. Yamamoto, IEEE Trans. ED, pp. 2162–2164, 1999). A structure has also been proposed, wherein after a transparent substrate is adhered to the surface of a single-crystalline thin-film solar cell formed on a single-crystalline silicon substrate with a porous silicon layer between them, the thin-film solar cell is separated from the single-crystalline silicon substrate and is adhered to a different substrate (JP-A HEI 10-150211).

In the thin-film solar cells described above, which are photovoltaic devices of the prior art, even though the light-receiving surface and the opposite surface are relatively close and this characteristic affects power generation efficiency, no consideration has been made to remove that effect by making the semiconductor surface opposite the light-receiving surface inactive. Therefore, the surface recombination velocity of carriers in the semiconductor surface opposite the light-receiving surface is high, which is a factor in lowering the open-circuit voltage. The effect of the surface recombination velocity on the power generation characteristic is particularly great in thinner solar cells, and therefore passivation at the semiconductor substrate surface is an important factor in improving conversion efficiency.

This invention is proposed to address the above problem, and an object thereof is to offer a photovoltaic device that improves conversion efficiency regardless of whether the light-receiving surface and the opposite surface are in close proximity by passivating the semiconductor surface opposite the light-receiving surface of the photovoltaic device.

SUMMARY OF THE INVENTION

In order to achieve the above object, the photovoltaic device of this invention, which converts incident light energy to electrical energy, comprises a single-crystalline or polycrystalline semiconductor substrate, an n-type diffusion layer region and a p-type diffusion layer region formed adjacent to each other on one surface of the semiconductor substrate, a first electrode electrically connected to the n-type diffusion layer region, a second electrode electrically connected to the p-type diffusion layer region, an adhesive layer formed on the other surface of the semiconductor substrate and containing an inorganic binder and a filler, and a supporting substrate adhered to the adhesive layer.

Further, the photovoltaic device of this invention comprises a single-crystalline or polycrystalline semiconductor substrate, an n-type diffusion layer region formed on one surface of the semiconductor substrate, a first electrode electrically connected to the n-type diffusion layer region, a p-type diffusion layer region formed on the other surface of the semiconductor substrate, a second electrode electrically connected to the p-type diffusion layer region, an adhesive layer formed on the other surface of the semiconductor substrate and containing an inorganic binder and a filler, and a supporting substrate adhered to the adhesive layer.

The inorganic binder contained in the adhesive layer may be an alkali silicate (sodium silicate, potassium silicate, or lithium silicate) or a metal phosphate (aluminum phosphate or magnesium phosphate).

The index of refraction of the adhesive layer may be not less than 1.4 and not more than 3.5.

The filler contained in the adhesive layer may be an aluminum oxide, titanium oxide, or barium oxide.

The photovoltaic device of this invention, as is clearly described above, uses an adhesive, which contains a substance that passivates the semiconductor surface, to adhere a diffuse-reflection substrate, which diffuses light it reflects, to the surface opposite the light-receiving surface of the semiconductor substrate, whereby the semiconductor substrate surface is passivated, and as a result the conversion efficiency is improved. In particular, a photovoltaic device with this structure can be used effectively in a thin-film solar cell wherein the thickness of the semiconductor layer is from 1 μm to 50 μm.

The above and other objects and features of this invention will be described below in detail based on the accompanying drawings.

DESCRIPTION OF THE PREFERRED EMBODIMENT

The photovoltaic device of this invention will be described in detail based on the drawings.

Figure 1:
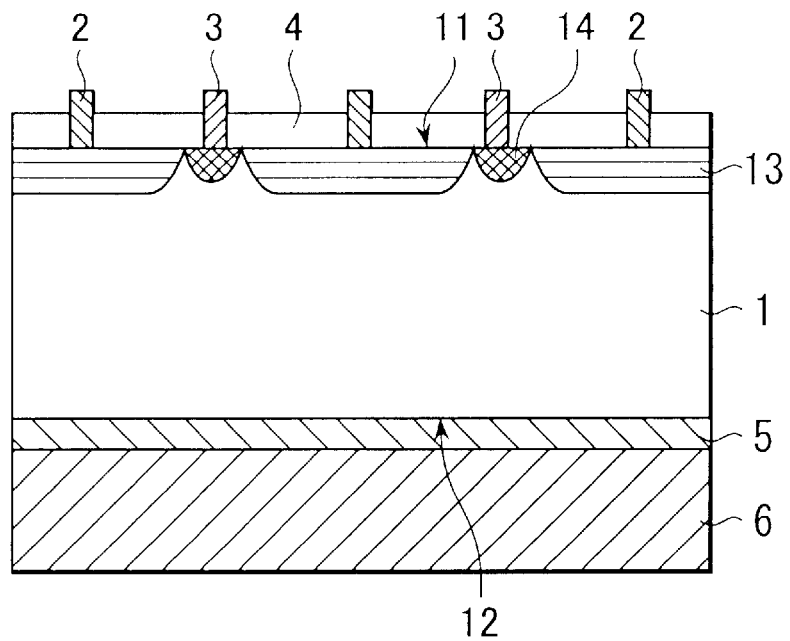
FIG. 1 is a sketch showing the cross section of a photovoltaic device equipped with two electrodes on the light-receiving surface of the semiconductor substrate as the first embodiment of the invention.

FIG. 1 is a sketch showing the cross section of a photovoltaic device having two electrodes on the light-receiving surface of the semiconductor substrate for describing the first embodiment of the invention. In FIG. 1, the semiconductor substrate 1 is a polycrystalline silicon but can also be a single-crystalline silicon, and it is of a p-type with an impurity concentration of $5 \times 10^{16}$ cm$^3$ with boron as the impurity, for example. The optimal thickness of this semiconductor substrate 1 is from 1 μm to 150 μm, but thinner is better. A diffusion layer n-type region 13 with an impurity concentration of $1 \times 10^{19}$ cm$^{-3}$ and a thickness of 0.3 μm, for example, and a p+-type region 14 with an impurity concentration of $1 \times 10^{20}$ cm$^{-3}$ and a thickness of 0.5 μm, for example, are formed alternately adjacent to each other on the main surface 11, which is the light-receiving surface, of this semiconductor substrate 1, and a 10 μm-wide, 2.0 μm-thick aluminum electrode 2 and a 10 μm-wide, 2.0 μm-thick aluminum electrode 3 are formed on the n-type region 13 and the p+-type region 14, respectively, with an ohmic connection. However, if it is possible to connect the electrodes directly to the semiconductor substrate 1 with an ohmic contact, the formation of the p+-type region 14 can be omitted. Ag, a Ti—Pd-Ag alloy, or W, Mo or other high-melting point metal can be used in place of aluminum for the above electrodes 2 and 3. Further, an aluminum oxide ($Al_2O_3$) diffuse-reflection substrate 6 that is 800 μm thick, for example, is adhered to the back surface 12 of the semiconductor substrate 1 by means of an adhesive layer 5 that is 0.5 μm thick, for example. In order to passivate the surfaces of the impurity diffusion layers 13 and 14, they are covered with a 0.1 μm-thick $SiO_2$ film 4. This film 4 is not limited to $SiO_2$ and can be $Si_3N_4$ or $TiO_2$, for example. Further, this film can also act to prevent reflection when receiving light.

In the photovoltaic device of FIG. 1 described above, the adhesive layer 5 itself, which is used when adhering the diffuse-reflection substrate 6, acts on the silicon surface to passivate the silicon substrate surface. A thin silicon oxide film can be formed on this substrate surface if it is of a thickness that will not interfere with passivation at the silicon substrate surface by the adhesive. As an adhesive with a passivation effect, it is particularly desirable that this adhesive contains an alkali silicate. More specifically, adhesives that contain an alkali metal silicate, for example, can be used as an adhesive that passivates the semiconductor surface. An adhesive that has an etching effect on the semiconductor substrate is particularly desirable. The adhesive used in this embodiment contains an inorganic binder, a hardener, and a filler. Of these, the use of an alkali silicate (sodium silicate, potassium silicate, or lithium silicate) or a metal phosphate (aluminum phosphate or magnesium phosphate) as the inorganic binder is important in achieving a passivation effect. Further, a hardener is generally used only to improve water resistance, and therefore it is not a critical component. A filler is used to adjust the coefficient of thermal expansion and to improve heat resistance, and aluminum oxide, titanium oxide, or barium oxide can be used as the filler.

The thickness of the adhesive layer 5 was 0.5 μm in the above embodiment, but as long as adhesion can be achieved without voids, thinner is better, with the desirable range being between 0.2 μm and 5.0 μm.

As described above, by means of this invention, the diffuse-reflection substrate 6 made from aluminum oxide ($Al_2O_3$) is adhered to the semiconductor substrate 1 as a supporting substrate using the adhesive layer 5, which passivates the back surface 12 of the semiconductor. Therefore, in addition to passivating the back surface of the semiconductor substrate, a structure is realized having a light confinement effect.

That is, if the index of refraction of the adhesive is adjusted in the range of 1.4 to 3.5, which is below the index of refraction of silicon, when the light reflected by the diffuse-reflection substrate 6 becomes incident on the silicon substrate 1 again, this reflected light is refracted so that it is efficiently confined in the silicon substrate due to the difference in the index of refraction between the silicon substrate 1 and the adhesive layer 5. In order to adjust the index of refraction of the adhesive in the range of 1.4 to 3.5, the effective index of refraction is improved by mixing particles of titanium oxide, aluminum oxide or other metal oxide or particles of titanium or aluminum in the adhesive, whereby the index of refraction can be easily adjusted within the above range depending on the amount of particles added. In this case, it is desirable that the diameter of the particles be in the range of 400 nm to 2 μm, which is the same as the wavelength of the solar light absorbed by the semiconductor substrate 1. Further, by using a substrate with a high diffuse-reflectance, such as an aluminum ceramic substrate, as the diffuse-reflection substrate 6, the light-confinement effect is further improved.

The photovoltaic device with the above structure is fabricated by the following process.

1) The thin-film silicon layer (semiconductor substrate 1) having a p-type impurity diffusion layer is formed on an insulation film formed on a silicon supporting substrate, 2) the p+-type impurity diffusion layer 14 is formed on the thin-film silicon layer by a thermal diffusion method, 3) similarly, the n-type impurity diffusion layer 13 is formed on the thin-film silicon layer by a thermal diffusion method, 4) the antireflection film 4 is formed on both the above diffusion layers 13 and 14 by a thermal oxidation, chemical vapor deposition, or sputtering method, 5) the first electrode 2 is formed on the diffusion layer 13 and the second electrode 3 is formed on the diffusion layer 14, 6) the thin-film silicon layer surface covered by the antireflection film is adhered to a glass or other substrate using wax for temporary adhesion, 7) the support substrate, including the insulation film, is removed by etching, 8) the diffuse-reflection substrate 6 is adhered to the resulting surface by the adhesive 5, and 9) the glass or other substrate that was temporarily attached is removed, whereby the photovoltaic device is obtained.

As described above, by adhering a diffuse-reflection substrate to the back surface of the semiconductor substrate using an adhesive that passivates the semiconductor substrate surface, a photovoltaic device with improved conversion efficiency can be obtained, in which both a high open-circuit voltage and a high short-circuit current can be achieved. More specifically, by using a 5 μm-thick single-crystalline semiconductor substrate and an adhesive containing an alkali silicate as a component, the open-circuit voltage is improved from 487 mV to 543 mV and the short-circuit current is improved 32%, thus demonstrating that the surface of the semiconductor substrate is effectively passivated.

Figure 2:
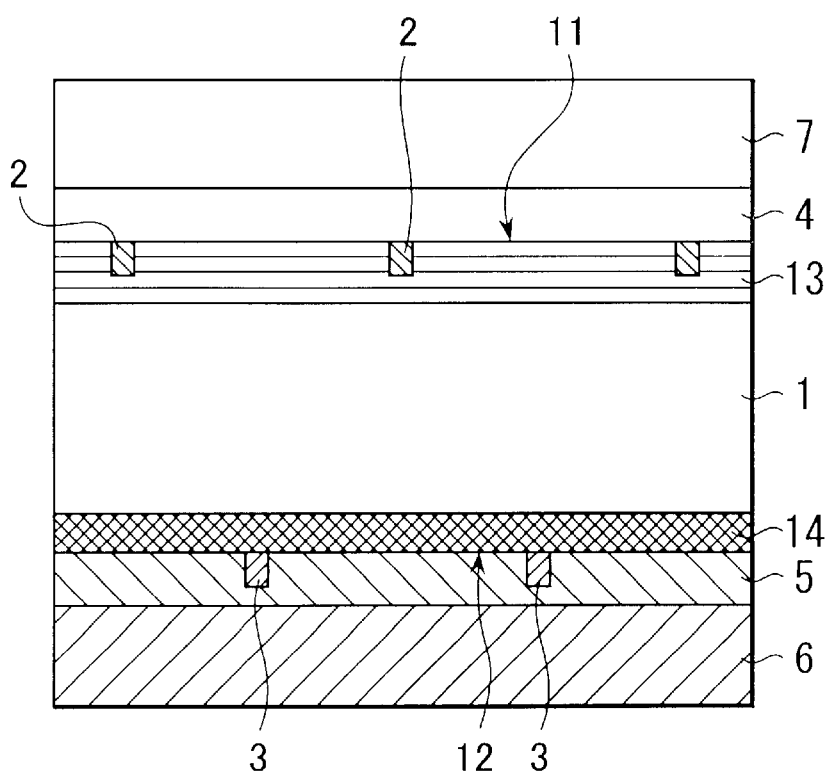
FIG. 2 is a sketch showing the cross section of a photovoltaic device equipped with one electrode on each of the opposite surfaces of the semiconductor substrate as the second embodiment of the invention.

FIG. 2 is a sketch showing the cross section of a photovoltaic device having one electrode on each of the opposite surfaces of the semiconductor substrate as the second embodiment of the invention. In FIG. 2, the semiconductor substrate 1 is a p-type substrate with an impurity concentration of $5\times10^{16}$ $cm^{-3}$ with boron as the impurity, or an i-type semiconductor substrate with a low impurity concentration, and it can be either polycrystalline silicon or single-crystalline silicon as in the device of the first embodiment. The optimal thickness of the semiconductor substrate 1 is from 1 μm to 150 μm, and a diffusion layer n-type region 13 with an impurity concentration of $1\times10^{19}$ $cm^{-3}$ is formed to a depth of 0.3 μm, for example, on the main surface 11, which is the light-receiving surface of the semiconductor substrate 1, after which a 10 μm-wide, 2.0 μm-thick first electrode 2 is disposed on this n-type region. A 0.1 μm-thick antireflection film layer 4 made from $SiO_2$ is formed on this n-type region 13, and a 0.5 μm-thick substrate made from glass is placed on top of this. A diffusion layer p+-type region 14 with an impurity concentration of $1\times10^{20}$ $cm^{-3}$ is formed to a thickness of 0.5 μm, for example, on the surface 12 opposite the light-receiving surface, and a second electrode 10 μm wide and 2.0 μm thick is disposed on this p+-type region 14. If the semiconductor substrate 1 is of a p-type and the electrode can be connected directly to the substrate with an ohmic contact, then the formation of this p+-type diffusion layer can be omitted.

The diffuse-reflection substrate 6 is fixed on top of this p+-type region 14 by an adhesive layer 5 as in the device of the first embodiment.

The above adhesive layer 5 contains a substance that passivates the surface of the semiconductor substrate 1 as in the first embodiment, and when the index of refraction is adjusted to between 1.4 and 3.5, it also has a light-confinement effect.

In the photovoltaic device of this embodiment, the second electrode, which blocks light, is moved to the back surface of the substrate 1, whereby conversion efficiency is further improved.

The photovoltaic device with the above structure is fabricated by the following process.

1) The antireflection film 4 is deposited on the transparent substrate 7 made from glass, etc., by a chemical vapor deposition or sputtering method,
2) the metal electrode 2 is formed on the antireflection film 4,
3) the n-type impurity diffusion layer region 13 is deposited on the antireflection film 4 by a chemical vapor deposition method,
4) the substrate 1 comprising a p+-type thin-film silicon layer is deposited on the n-type impurity diffusion layer 13 by a chemical vapor deposition method,
5) the region 14 comprising a p+-type impurity diffusion layer is formed on the substrate 1 by a thermal diffusion or chemical vapor deposition method,
6) the metal electrode 3 is formed on the p+-type impurity diffusion layer 14,
7) the diffuse-reflection substrate 6 is adhered to the top of the diffusion layer 14 using the adhesive 5, whereby the photovoltaic device is obtained.

As described above, by using an adhesive containing an inorganic binder in the photovoltaic device of this invention, the semiconductor surface is passivated, but the reason therefor is yet unclear. However, since the open-circuit voltage is increased even though the light-receiving surface of the substrate and the opposite surface are in close proximity, it is thought that recombination of carriers in the semiconductor surface is decreased.

Since the photovoltaic device of this invention is configured as described above, the effects described below can be realized.

That is, a photovoltaic device can be realized that has a structure wherein the surface of the semiconductor substrate is passivated, the conversion efficiency is high and the attachment of electrodes is easy.

Further, in addition to passivating the surface of the semiconductor substrate, one of the electrodes is moved to the surface opposite the light-receiving surface, whereby the surface area where light is blocked by electrodes is reduced, thus realizing a photovoltaic device with a structure having an even higher conversion efficiency.

In addition, the index of refraction for light is increased in the adhesive layer, whereby the light-confinement effect is improved and a photovoltaic device with an even higher conversion efficiency is realized.

What is claimed is:

1. A photovoltaic device comprising a semiconductor substrate, an n-type diffusion layer region and a p-type diffusion layer region formed adjacent to each other on a light-receiving surface of said semiconductor substrate, a first electrode electrically connected to said n-type diffusion layer region, a second electrode electrically connected to said p-type diffusion layer region, an adhesive layer formed on an opposite surface from said light-receiving surface of said semiconductor substrate and containing an inorganic binder and a filler, and a supporting substrate adhered to said adhesive layer.

2. A photovoltaic device comprising a semiconductor substrate, an n-type diffusion layer region formed on a light-receiving surface of said semiconductor substrate, a first electrode electrically connected to said n-type diffusion layer region, a p-type diffusion layer region formed on an opposite surface from said light-receiving surface of said semiconductor substrate, a second electrode electrically connected to said p-type diffusion layer region, an adhesive layer formed on said p-type diffusion layer region for passivating said opposite surface and containing an inorganic binder and a filler, and a supporting substrate adhered to said adhesive layer.

3. The photovoltaic device of claim 1, wherein an index of refraction of said adhesive layer is not less than 1.4 and not more than 3.5.

4. The photovoltaic device of claim 2, wherein an index of refraction of said adhesive layer is not less than 1.4 and not more than 3.5.

5. The photovoltaic device of claim 1, wherein the filler contained in said adhesive layer is aluminum oxide, titanium oxide or barium oxide.

6. The photovoltaic device of claim 2, wherein the filler contained in said adhesive layer is aluminum oxide, titanium oxide or barium oxide.

7. The photovoltaic device of claim 1, wherein the inorganic binder contained in said adhesive layer is an alkali silicate or metal phosphate.

8. The photovoltaic device of claim 2, wherein the inorganic binder contained in said adhesive layer is an alkali silicate or metal phosphate.

9. The photovoltaic device of claim 7, wherein said alkali silicate is selected from the group consisting of sodium silicate, potassium silicate, and lithium silicate.

10. The photovoltaic device of claim 8, wherein said alkali silicate is selected from the group consisting of sodium silicate, potassium silicate, and lithium silicate.

11. The photovoltaic device of claim 7, wherein said metal phosphate is aluminum phosphate or magnesium phosphate.

12. The photovoltaic device of claim 8, wherein said metal phosphate is aluminum phosphate or magnesium phosphate.

* * * * *